(12) United States Patent
Kuo et al.

(10) Patent No.: US 8,441,134 B2
(45) Date of Patent: May 14, 2013

(54) CHIP STACKING STRUCTURE

(75) Inventors: Chien-Li Kuo, Hsinchu (TW);
Yung-Chang Lin, Taichung (TW);
Ming-Tse Lin, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 12 days.

(21) Appl. No.: 13/228,549

(22) Filed: Sep. 9, 2011

(65) Prior Publication Data

US 2013/0062780 A1    Mar. 14, 2013

(51) Int. Cl.
*H01L 23/52* (2006.01)
*H01L 23/48* (2006.01)
*H01L 27/146* (2006.01)
*H01L 27/148* (2006.01)

(52) U.S. Cl.
USPC ............... 257/777; 257/778; 257/E27.137; 257/E27.144; 257/E27.161

(58) Field of Classification Search .......... 257/777, 257/778, E27.137, E27.144, E27.161
See application file for complete search history.

(56) References Cited

U.S. PATENT DOCUMENTS

| 6,150,724 | A  | * | 11/2000 | Wenzel et al. | 257/777 |
|---|---|---|---|---|---|
| 6,462,420 | B2 | * | 10/2002 | Hikita et al. | 257/777 |
| 7,683,478 | B2 |   | 3/2010  | Chen et al.   |         |
| 7,800,138 | B2 |   | 9/2010  | Baek et al.   |         |
| 7,989,959 | B1 | * | 8/2011  | Rahman        | 257/777 |
| 2004/0004292 | A1 | * | 1/2004 | Hsieh et al. | 257/778 |
| 2010/0171208 | A1 | * | 7/2010 | Fujii         | 257/686 |
| 2012/0098140 | A1 | * | 4/2012 | Bartley et al.| 257/774 |

OTHER PUBLICATIONS

K. N. Chen, T. M. Shaw, C. Cabral, Jr. and G. Zuo, "Reliability and structural design of a wafer-level 3D integration scheme with W TSVs based on Cu-oxide hybrid wafer bonding", 2010, IEEE.

* cited by examiner

*Primary Examiner* — Luan C Thai
(74) *Attorney, Agent, or Firm* — WPAT, PC; Justin King

(57) ABSTRACT

A chip stacking structure includes a first chip and a second chip. The first chip includes a surface having a first group of pads formed thereon, and the second chip includes a surface having a second group of pads formed thereon. The second group of pads is bonded onto the first group of pads to define a plurality of capillary passages extending in a same direction. The chip stacking structure further includes an underfill filling up interspaces between the first chip and the second chip. The chip stacking structure is capable of avoiding chip deformation and cracking during a bonding process.

10 Claims, 4 Drawing Sheets

CHIP STACKING STRUCTURE

FIELD OF THE INVENTION

The present invention relates generally to integrated circuits, and more particularly to a chip stacking structure filled with underfill.

BACKGROUND OF THE INVENTION

Nowadays, logic circuits and memory circuits are usually fabricated by different semiconductor factories, and then packaged in same integrated circuits (IC) using certain packaging techniques. Generally, to reduce the size of the IC, three-dimensional packaging technique is employed to finish the packaging process. However, as shown in FIG. 1, during a bonding process for stacking two different IC chips 11 and 12, the upper IC chip 12 is usually deformed due to the high process temperature of the bonding process or cracks due to the high inner stress. Thus, it is difficult to improve the yield rate. Therefore, there is a desire to overcome above problems.

SUMMARY OF THE INVENTION

In one embodiment, a chip stacking structure includes a first chip and a second chip. The first chip includes a surface having a first group of pads formed thereon, and the second chip includes a surface having a second group of pads formed thereon. The second group of pads is bonded onto the first group of pads to define a plurality of capillary passages extending in a same direction. The chip stacking structure further includes an underfill filling up interspaces between the first chip and the second chip.

The above chip stacking structure has uniformly distributed supporting points and capillary passages which are capable of efficiently filling up the interspaces between the stacked chips. Therefore, the chip deformation or cracking can be avoided, and the yield rate is also improved. To facilitate the heat fusing for the bonding process, one of the first group of pads and the second group of pads can be formed using a material having lower melting points than that of another one.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
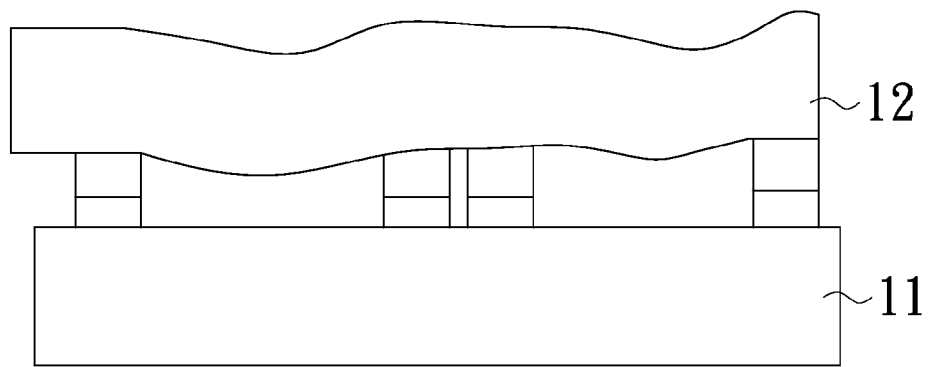
FIG. 1 is a schematic view showing a known chip stacking structure.
Figure 2A:
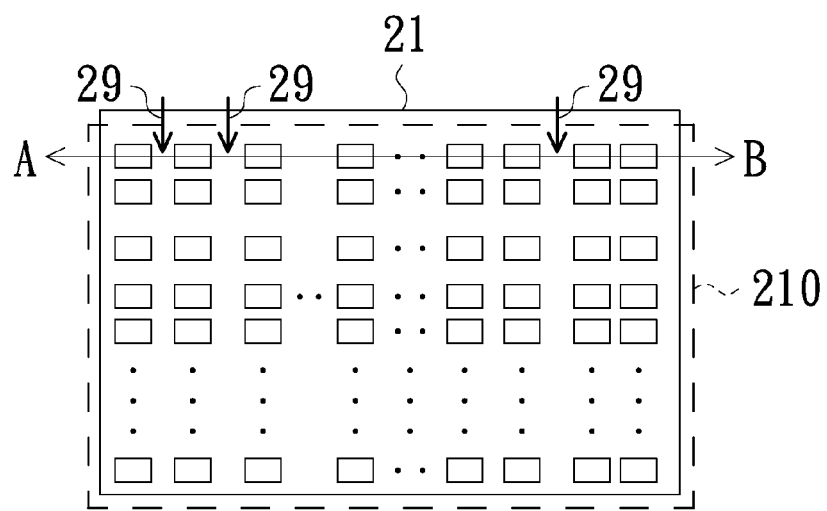
FIGS. 2A to 2C are schematic views illustrating a chip stacking structure according to an embodiment.
Figure 2B:
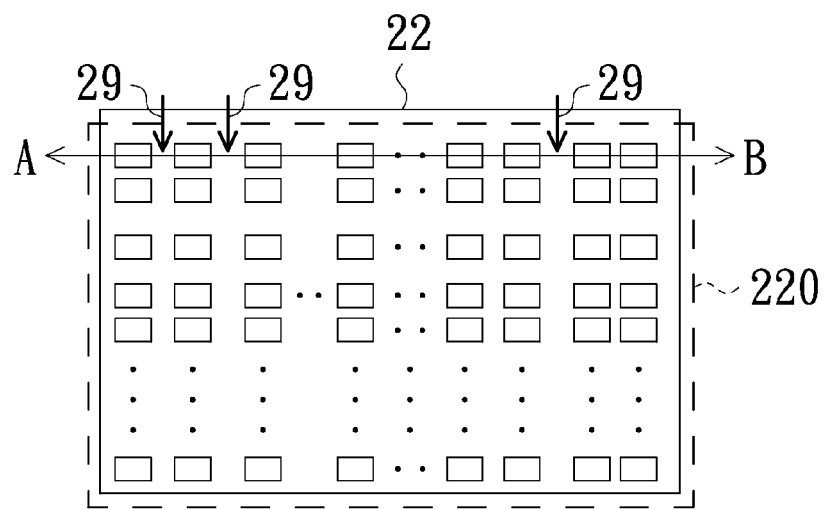
Figure 2C:
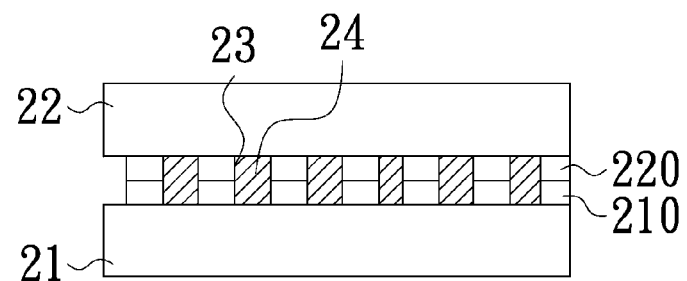

FIGS. 2A through 2C are schematic views illustrating a chip stacking structure according to an embodiment, wherein FIG. 2A shows a first group of pads 210 are formed on a surface of a first chip 21, and FIG. 2B illustrates a second group of pads 220 are formed on a surface of a second chip 22. The first group of pads 210 and the second group of pads 220, for example, are orderly arranged in an array. As clearly shown in the figures, first, the first group of pads 210 and the second group of pads 220 are arranged in one-on-one correspondence; second, after the first group of pads 210 is bonded onto the second group of pads 220, a number of capillary passages extending in a same direction as indicated by an arrow 29 in the figures is defined. The one-on-one correspondence means that the number of pads in the first groups of pads 210 and the second group of pads 220 are the same, and after bonded together, each of the first group of pads 210 is bonded onto an individual pad of the second group of pads 220. Generally, due to the different chip design, the number of functional pads in the first group of pads 210 and the second group of pads 220 may be different. Thus, to establish above one-on-one correspondence, dummy pads can be used in the first chip 21 or the second chip 22. That is to say, if there is not a functional pad in the first chip 21 corresponding to a certain functional pad of the second chip 22, a dummy pad should be formed in the first chip 21. The same rule is also applied to the second chip 22. The dummy pads are pads that don't need to establish electrical connections and only for obtain the above one-on-one correspondence in the bonding process.

FIG. 2C is a cross sectional schematic view taken along a line A-B after the first chip 21 and the second chip 22 are bonded together. After this, interspaces between the first chip 21 and the second chip 22 can be filled with underfill 24 using the capillary passages 23. Since the width of the capillary passages 23 is designed to be in a suitable range such that the underfill 24 easily moves along the capillary passages 23 due to the capillary effect to fill up the capillary passages 23 and also easily fills up the interspaces aside the capillary passages 23. Generally, different underfill 24 or the underfill 24 from different suppliers may have different characteristics such as viscosity. Thus, the spreading ability in the capillary passages 23 is also different. To optimize the capillary effect for different underfill 24, the width of the capillary passages 23, in other words, the distance between adjacent pads of the first chip 21 or the second chip 22, can be adjusted according to the practical requirements. Suitable underfill materials include but are not limited to epoxy materials, cyanate ester materials, acrylic materials, and other underfill materials. The underfill material may include a variety of optional components, such as fillers (for example silica fillers) to modify a coefficient of thermal expansion or other properties of the underfill material, adhesion promoters, hardeners, or other optional chemical additives.

Figure 3A:
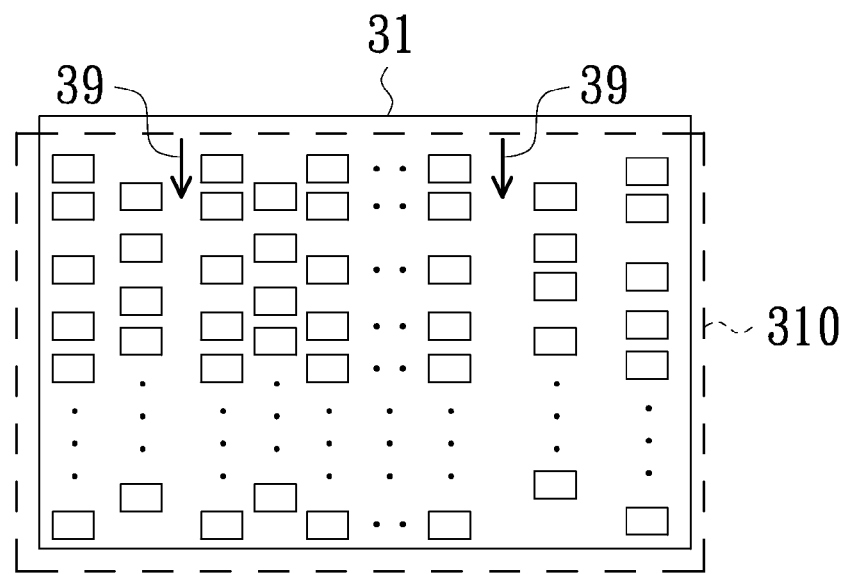
FIGS. 3A to 3B are schematic views illustrating a chip stacking structure according to another embodiment.
Figure 3B:
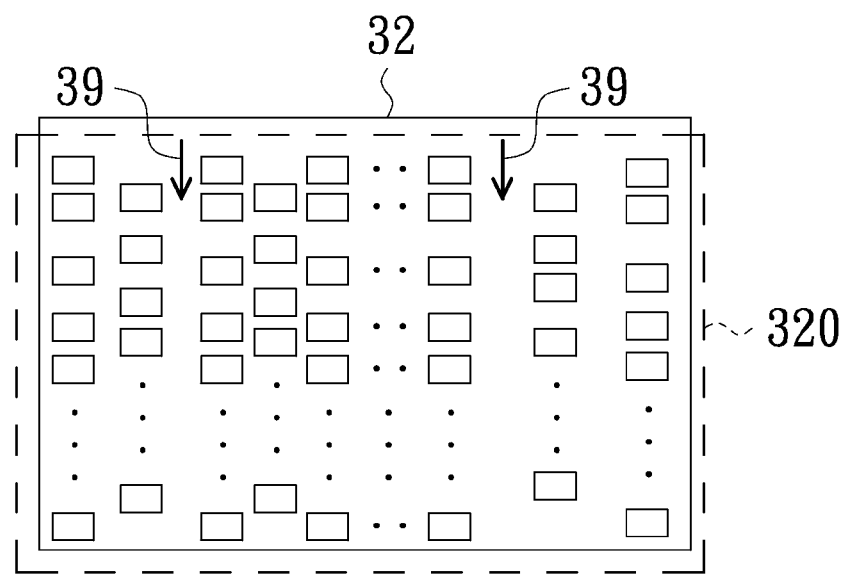

FIGS. 3A through 3B are schematic views illustrating a chip stacking structure according to another embodiment, wherein FIG. 3A shows a first group of pads 310 are formed on a surface of a first chip 31, and FIG. 3B illustrates a second group of pads 320 are formed on a surface of a second chip 32. The first group of pads 310 or the second group of pads 320 comprises a first column and a second column each comprises a plurality of pads, and the pads in the first column is staggered with the pads in the second column. In another embodiment, each of the pads in the first column is located on a midnormal of two corresponding adjacent pads in the second column.

As clearly shown in the figures, the chip stacking structure of the present embodiment is different from the above embodiment in that the pads at opposite sides of the capillary passages are not aligned. The present configuration provides more flexibility for the layout arrangement of the circuits in the first chip 31 or the second chip 32. However, the first group of pads 310 and the second group of pads 320 still maintain the following features: first, the number and the position of the pads in the first group of pads 310 and the second group of pads 320 are arranged in one-on-one correspondence; second, a number of capillary passages extending along a direction indicated by an arrow 39 are also defined after the first group of pads 310 are bonded onto the second group of pads 320 thereby obtaining a chip stacking structure similar to that show in FIG. 2C.

Figure 4A:
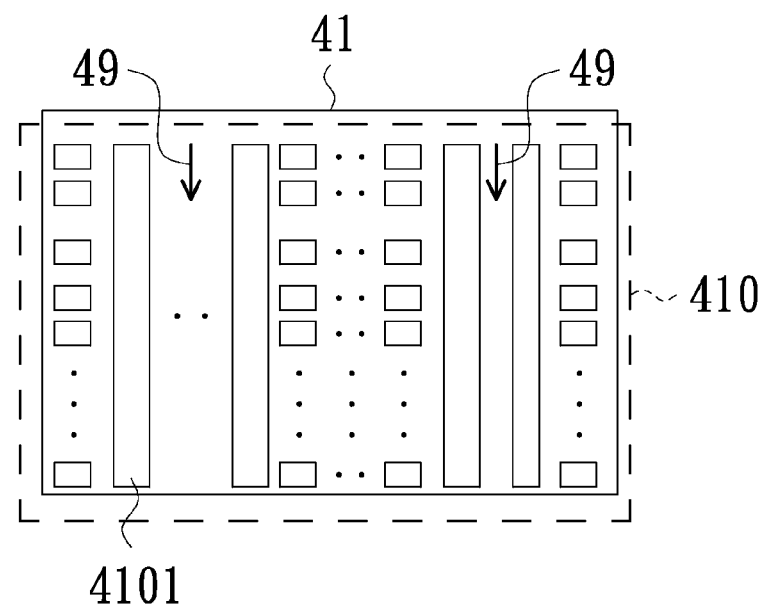
FIGS. 4A to 4B are schematic views illustrating a chip stacking structure according to still another embodiment.
Figure 4B:
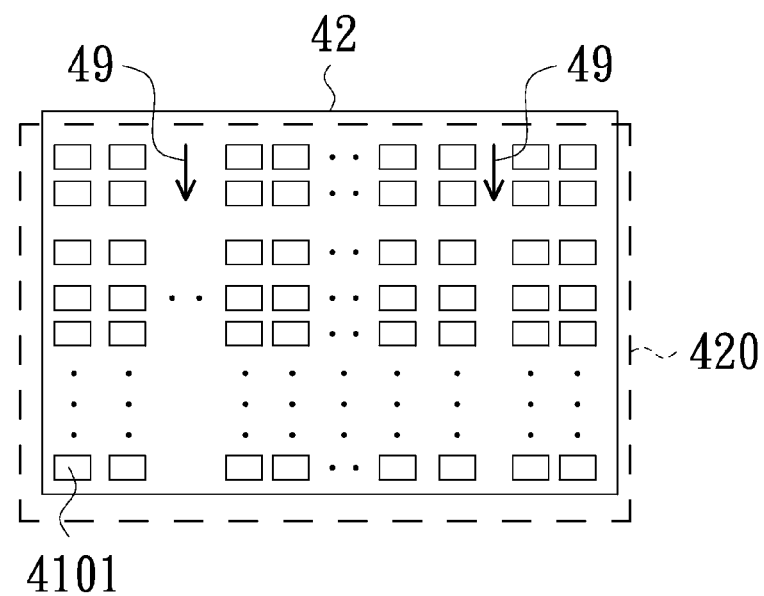

FIGS. 4A through 4B are schematic views illustrating a chip stacking structure according to still another embodiment, wherein FIG. 4A shows a first group of pads 410 are formed on a surface of a first chip 41, and FIG. 4B illustrates a second group of pads 420 are formed on a surface of a second chip 42. As clearly shown in the figures, the chip stacking structure of the present embodiment is different from the above embodiments in that dummy pads at opposite sides of the capillary passages may be different. This configuration provides more flexibility for the layout arrangement of the circuits in the first chip 41 or the second chip 42. However, the first group of pads 410 and the second group of pads 420 still maintain the following features: first, the position of the pads in the first group of pads 410 and the second group of pads 420 are arranged correspondingly; second, a number of capillary passages extending along a direction indicated by an arrow 49 are also produced after the first group of pads 410 are bonded onto the second group of pads 420. Moreover, in the present embodiment, one dummy pad may correspond to a number of functional pads. That is, after bonded together, a number of functional pads in the first chip 41 or the second chip 42 may be bonded onto only one dummy pad. Besides, the capillary passages may have different width in the chip stacking structure obtained after the first chip 41 is bonded onto the second chip 42. As such, the first chip 41 and the second chip 42 provides more flexibility for the layout design of circuits.

According to above description, chip stacking structures of above embodiments have uniformly distributed supporting points and capillary passages which are capable of efficiently filling up the interspaces between the stacked chips. Therefore, the chip deformation or cracking can be avoided, and the yield rate is also improved. Due to the capillary effect, there are no voids formed in the obtained underfill in the interspaces between the stacked chips. Besides, the capillary filling processes doesn't waste any underfill during the filling process, and thus the material cost of the underfill filling process is reduced. To facilitate the heat fusing for the bonding process, one of the first group of pads and the second group of pads can be formed using a material having lower melting points than that of another one.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A chip stacking structure, comprising:
    a first chip, comprising a surface having a first group of pads formed thereon;
    a second chip, comprising a surface having a second group of pads formed thereon, the second group of pads being bonded onto the first group of pads to define a plurality of capillary passages extending in a same direction; and
    an underfill filling up interspaces between the first chip and the second chip, wherein the first group of pads or the second group of pads comprises a dummy pad and another group of pads comprises a functional pad, at least one of the dummy pad corresponding to at least one of the functional pad.

2. The chip stacking structure of claim 1, wherein the first group of pads comprises a dummy pad.

3. The chip stacking structure of claim 2, wherein a plurality of pads in the second group of pads are bonded onto the dummy pad.

4. The chip stacking structure of claim 1, wherein the second group of pads comprises a dummy pad.

5. The chip stacking structure of claim 4, wherein a plurality of pads in the first group of pads are bonded onto the dummy pad.

6. The chip stacking structure of claim 1, wherein the first group of pads are bonded onto the second group of pads in one-on-one correspondence.

7. The chip stacking structure of claim 1, wherein the first group of pads consist of an electrically conductive material having a lower melting point than that of the second group of pads.

8. The chip stacking structure of claim 1, wherein the first group of pads or the second group of pads comprises a first column and a second column, wherein each column comprises a plurality of pads, and the pads in the first column is staggered with the pads in the second column.

9. The chip stacking structure of claim 8, wherein each of the pads in the first column is located on a midnormal of two corresponding adjacent pads in the second column.

10. The chip stacking structure of claim 1, wherein the first group of pads is orderly arranged in an array.

* * * * *